(12) United States Patent
Lewis et al.

(10) Patent No.: US 10,834,839 B1
(45) Date of Patent: Nov. 10, 2020

(54) BARRIER FOR HYBRID SOCKET MOVEMENT REDUCTION

(71) Applicant: INTERNATIONAL BUSINESS MACHINES CORPORATION, Armonk, NY (US)

(72) Inventors: Theron Lee Lewis, Rochester, MN (US); Timothy Jennings, Rochester, MN (US); Timothy Younger, Rochester, MN (US); David Braun, St. Charles, MN (US); John R. Dangler, Rochester, MN (US); Jennifer I. Bennett, Rochester, MN (US); James Bielick, Pine Island, MN (US); Stephen Hugo, Stewartville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/552,049

(22) Filed: Aug. 27, 2019

(51) Int. Cl.
| | |
|---|---|
| *H05K 7/10* | (2006.01) |
| *H05K 13/04* | (2006.01) |
| *H01R 13/24* | (2006.01) |
| *H01R 12/52* | (2011.01) |
| *H01L 23/498* | (2006.01) |
| *H05K 3/34* | (2006.01) |

(Continued)

(52) U.S. Cl.
CPC ..... *H05K 7/1061* (2013.01); *H01L 21/76882* (2013.01); *H01L 23/49816* (2013.01); *H01L 24/35* (2013.01); *H01R 12/52* (2013.01); *H01R 13/2485* (2013.01); *H05K 3/3494* (2013.01); *H05K 13/0465* (2013.01); *H05K 2201/10325* (2013.01); *H05K 2201/10719* (2013.01)

(58) Field of Classification Search
CPC ............ H05K 7/1061; H01L 21/76882; H01L 23/498
USPC ........................................................ 439/71
See application file for complete search history.

(56) References Cited

U.S. PATENT DOCUMENTS

| | | | |
|---|---|---|---|
| 6,504,095 B1 * | 1/2003 | Hoffstrom ............ | H05K 5/0091 174/520 |
| 7,014,488 B2 * | 3/2006 | Stone ................... | H05K 7/1053 439/135 |

(Continued)

FOREIGN PATENT DOCUMENTS

| | | |
|---|---|---|
| JP | H08181246 A | 7/1996 |
| WO | 0219424 A2 | 3/2002 |

OTHER PUBLICATIONS

Cole et al., "Overcoming head-in-pillow defects in hybrid LGA socket assembly", 2012 Research Gate.https://www.researchgate.net/publication/281653081_OVERCOMING_HEAD-IN-PILLOW_DEFECTS_IN_HYBRID_LGA_SOCKET_ASSEMBLY , 11P.

(Continued)

*Primary Examiner* — Alexander Gilman
(74) *Attorney, Agent, or Firm* — Cantor Colburn LLP; Tihon Poltavets (57) ABSTRACT

Aspects of the invention include an apparatus to aid a surface mount connection process including a barrier, a substrate in a facing spaced relationship with the barrier, a hybrid land grid array (LGA) socket interposed between the barrier and the substrate, and at least one fastening mechanism securing the barrier to the substrate at a selected distance such that a gap is formed between the barrier and the hybrid LGA socket.

20 Claims, 6 Drawing Sheets

(51) Int. Cl.
  *H01L 23/00*   (2006.01)
  *H01L 21/768*  (2006.01)

(56) References Cited

U.S. PATENT DOCUMENTS

| | | | | |
|---|---|---|---|---|
| 7,177,142 B2* | 2/2007 | Kabadi | ............... | H05K 3/308 257/779 |
| 7,377,791 B2* | 5/2008 | Liao | ............... | H05K 7/10 439/71 |
| 7,581,963 B2* | 9/2009 | Liao | ............... | H05K 7/1069 439/378 |
| 7,787,250 B2* | 8/2010 | Li | ............... | H01L 23/04 361/715 |
| 8,622,278 B1* | 1/2014 | Alvarez | ............... | H05K 13/0465 228/212 |
| 9,006,876 B2* | 4/2015 | Watanabe | ............... | H01L 24/90 257/678 |
| 9,082,766 B2* | 7/2015 | Goudarzi | ............... | H01L 23/49811 |
| 9,437,577 B2* | 9/2016 | Hsu | ............... | H01L 24/17 |
| 9,773,719 B2* | 9/2017 | Meinhold | ............... | H01L 23/492 |
| 9,980,367 B2* | 5/2018 | Perng | ............... | H05K 3/301 |
| 10,096,539 B2* | 10/2018 | Kasahara | ............... | H01L 23/3121 |
| 10,242,941 B1* | 3/2019 | Su | ............... | H01L 23/49816 |
| 10,320,103 B2* | 6/2019 | Gui | ............... | H01R 12/716 |
| 10,361,505 B2* | 7/2019 | Liao | ............... | H01R 24/28 |
| 2005/0003580 A1* | 1/2005 | Arai | ............... | H01L 25/0657 438/109 |
| 2008/0054424 A1* | 3/2008 | Celaya | ............... | H05K 1/181 257/678 |
| 2010/0133665 A1* | 6/2010 | Ha | ............... | H01L 25/0657 257/666 |
| 2010/0171207 A1* | 7/2010 | Shen | ............... | H01L 21/565 257/686 |
| 2011/0115081 A1* | 5/2011 | Osumi | ............... | H01L 23/49811 257/737 |
| 2011/0117700 A1* | 5/2011 | Weng | ............... | H01L 23/3128 438/109 |
| 2011/0287638 A1* | 11/2011 | Beaman | ............... | H01L 23/4006 439/65 |
| 2012/0001306 A1* | 1/2012 | Wang | ............... | H01L 23/49503 257/666 |
| 2012/0015481 A1* | 1/2012 | Kim | ............... | H01L 25/0657 438/108 |
| 2012/0231584 A1* | 9/2012 | Kawahara | ............... | H01L 21/568 438/122 |
| 2013/0341784 A1* | 12/2013 | Lin | ............... | H01L 24/20 257/737 |
| 2014/0035892 A1* | 2/2014 | Shenoy | ............... | H01L 23/15 345/205 |
| 2014/0077349 A1* | 3/2014 | Higgins, III | ............... | H01L 24/13 257/692 |
| 2014/0124947 A1* | 5/2014 | Chuang | ............... | H01L 23/562 257/774 |
| 2014/0183761 A1* | 7/2014 | Lin | ............... | H01L 21/568 257/787 |
| 2015/0021760 A1* | 1/2015 | Lin | ............... | H01L 25/03 257/737 |
| 2015/0091178 A1* | 4/2015 | Reber | ............... | H01L 23/481 257/774 |
| 2017/0263543 A1* | 9/2017 | Bang | ............... | H01L 23/49827 |
| 2018/0145033 A1* | 5/2018 | Yi | ............... | H01L 23/49838 |
| 2018/0158779 A1* | 6/2018 | Yang | ............... | H01L 23/552 |
| 2020/0027784 A1* | 1/2020 | Park | ............... | H01L 23/481 |

OTHER PUBLICATIONS

Nowland et al., "Telecommunications Case Studies Address Head-in-Pillow (HnP) Defects and Mitigation through Assembly Process Modifications and Control" 2009, 19p.

Oliphant, et al., "Head-On-Pillow Defect—A Pain in the Neck or Head-On-Pillow BGA Solder Defect", IPC Printed Circuit Expo, APEX & Designer Summit Proceedings, 9p.

Scalzo et al., "Addressing the Challenge of Head-in-Pillow Defects in Electronics Assembly", www.techni-tool.com, 2012, 5p.

Slide Player, [online]; [retrieved on Aug. 22, 2019]; retrieved from the Internet https://slideplayer.com/slide/9266025/ Van Dreel et al., "FCBGA Package Warpage Definition Stage Project" HDP User Group Member Meeting, May 28, 2013.

Zhao, et al., "Effects of Package Warpage on Head-in-Pillow Defect", Materials Transactions, vol. 56, No. 7, 2015, pp. 6.

* cited by examiner

BARRIER FOR HYBRID SOCKET MOVEMENT REDUCTION

BACKGROUND

The present invention generally relates to area array devices, and more specifically, to sockets for area array devices.

An area array device has an array of electrical contacts on a face of the device, instead of having pins or other contacts around a perimeter of the device. An array of contact pads provides far more electrical connections than do contacts around a perimeter. Area array devices also have heat conduction and electrical performance advantages. Area array devices can be electrically connected by using a socket, or by directly soldering the contact pads to form connections.

SUMMARY

Embodiments of the present invention are directed to a barrier for hybrid socket movement reduction.

According to one or more embodiments of the present invention, an apparatus to aid a surface mount connection process is provided. The apparatus includes a barrier, a substrate in a facing spaced relationship with the barrier, a hybrid land grid array (LGA) socket interposed between the barrier and the substrate, and at least one fastening mechanism securing the barrier to the substrate at a selected distance such that a gap is formed between the barrier and the hybrid LGA socket.

According to another embodiment of the present invention, a method of surface mount connecting a hybrid LGA socket to a substrate is provided. The method includes applying connecting material onto a substrate contact pad of the substrate and placing the hybrid LGA socket onto the substrate such that a socket contact pad of the hybrid LGA socket aligns with the substrate contact pad. The method also includes attaching a barrier to the substrate using at least one fastening mechanism. The substrate being in a facing spaced relationship with the barrier and the hybrid LGA socket being interposed between the barrier and the substrate. The method further includes adjusting and securing the barrier to the substrate at a selected distance such that a gap is formed between the barrier and the hybrid LGA socket.

According to another embodiment of the present invention, a barrier to aid a surface mount connection process is provided. The barrier includes a first side, a second side opposite the first side, one or more orifices extending from the first side to the second side, and at least one fastening mechanism operable to secure the barrier to a substrate at a selected distance such that a gap is formed between the barrier and a hybrid LGA socket interposed between the barrier and the substrate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiment of the present invention provide a barrier to maintain socket contacts during a surface mount connection process.

As will be described herein, a type of socket that provides electrical connections for some area array devices is a land grid array ("LGA") socket. A hybrid LGA socket has an array of pressure spring contact posts on one side to provide electrical connections for an area array device and has surface mount connections on an opposite side, for direct connection to a substrate.

The LGA sockets sometimes provide a large number of electrical connections for an area array device. These LGA sockets are sized large enough to fit each of the electrical connections that they provide. For a hybrid LGA socket, this means that in addition to the contacts for the area array device, there is often a large number of surface mount connections for connection to a substrate. Often solder balls are used for the surface mount connection.

The high temperatures used during reflow soldering can cause a hybrid LGA socket to expand, contract, bend, distort, or warp, leading to misaligned or non-wet connections between the hybrid LGA socket and the substrate. These problems can increase with larger hybrid LGA sockets, as the higher surface areas between the sockets and the substrate make it more difficult to maintain sufficient flatness for forming successful electrical connections. Differential expansion and contraction of a hybrid LGA socket due to heating and cooling of the socket during reflow soldering can cause a permanent distortion or warpage of the finished socket assembly, especially for large hybrid LGA sockets.

From the foregoing discussion, it should be apparent that a need exists for an apparatus, system, and method to maintain socket contacts. Beneficially, such an apparatus, system, and method would maintain socket contacts during a surface mount connection process.

Embodiments disclosed herein been developed in response to the present state of the art, and in particular, in response to the problems and needs in the art that have not yet been fully solved by currently available area array device socket alignment techniques. Accordingly, the present invention has been developed to provide an apparatus, system, and method for socket contact alignment that overcome many or all of the above-discussed shortcomings in the art.

One or more embodiments of the present invention provide technological improvements over current methods to maintain socket contacts during a surface mount connection process that require force to be applied to the socket. One or more embodiments of the present invention provide technical solutions to one or more of these disadvantages of existing solutions by using a barrier located at a distance away from the socket to barrier to maintain socket contacts during a surface mount connection process.

Figure 1:
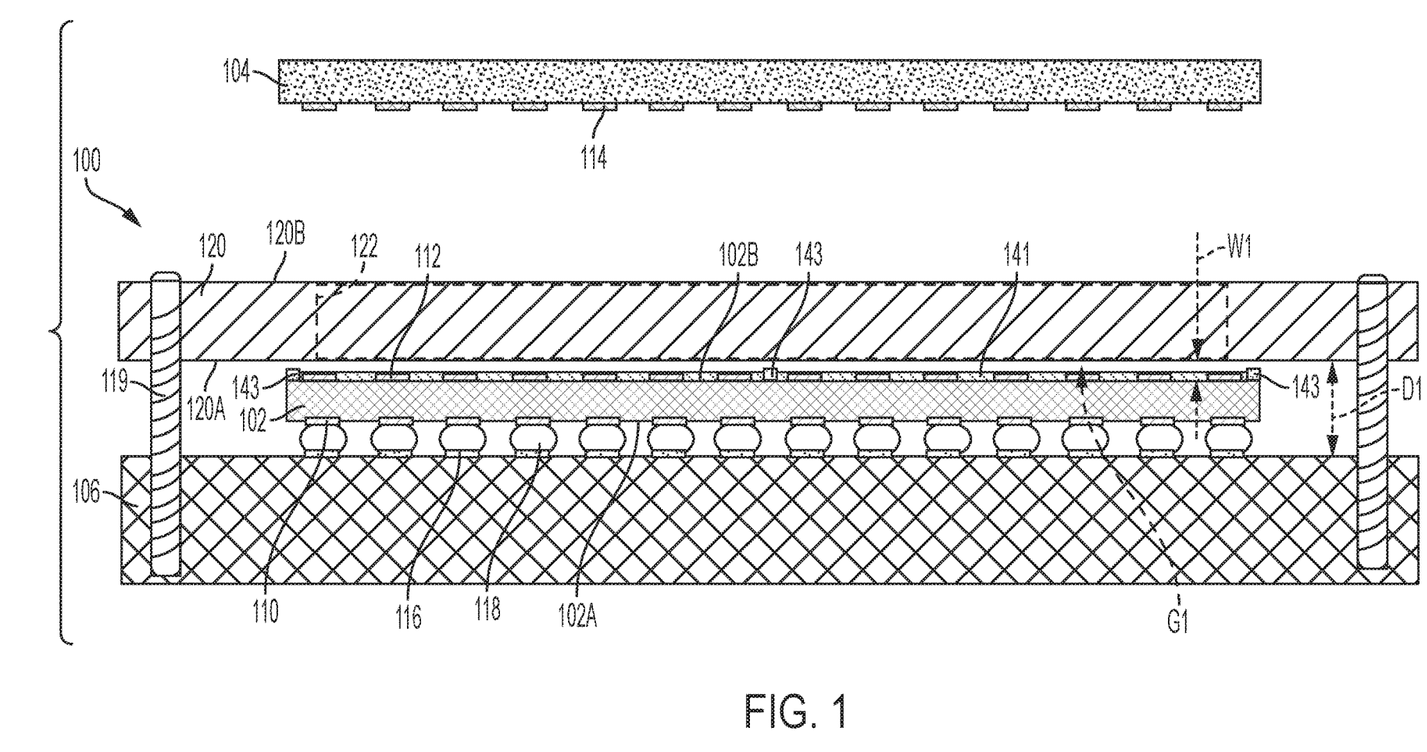
FIG. 1 is an illustration of an apparatus to aid in the surface mount connection process of the socket to a substrate, in accordance with an embodiment of the present disclosure.

Referring now to FIG. 1 an apparatus 100 to aid in the surface mount connection process of a hybrid LGA socket 102 to a substrate 106 (e.g., a printed circuit board (PCB)) is generally shown in accordance with an embodiment of the present disclosure. In the depicted embodiment, the apparatus 100 includes a hybrid LGA socket 102, a substrate 106, a group of socket contact pads 110, a group of socket contact posts 112, a group of substrate contact pads 116, a substrate connecting material 118, and a fastening mechanism 119. The hybrid LGA socket 102 may include a lid 141 that remains in place during the surface mount connection process. The hybrid LGA socket 102 also includes a housing frame 143. The group of socket contact posts 112 may be recessed within the lid 141 and the housing frame 143, as illustrated in FIG. 1. An orifice 122 may be present within the hybrid LGA socket 102. The substrate 106 is in a facing spaced relationship with the barrier 120. The hybrid LGA socket 102 is interposed between the barrier 120 and the substrate 106. The fastening mechanism 119 secures the barrier 120 to the substrate 106. The fastening mechanism 119 may be adjustable to adjust the selected distance D1 between the barrier 120 and the substrate 106. The fastening mechanism 119 may be a screw or spring loaded clip. There may be more than one fastening mechanism 119 in the apparatus 100. A fastening mechanism 119 may be located proximate each corner 120F (see FIG. 3C) of the barrier 120.

The area array device 104 includes a group of area array contact pads 114 that may be inserted into the group of contact posts 112 later after the surface mount connection process. The apparatus 100, in the depicted embodiment, uses the barrier 120 to maintain contact between the group of socket contact pads 110 with the substrate connecting material 118 and the group of substrate contact pads 116 with the substrate connecting material 118 during a surface mount connection process. A surface mount connection process may include reflow soldering of the hybrid LGA socket 102 to the substrate 106. Advantageously, by maintaining contact between the group of socket contact pads 110 with the substrate connecting material 118 and the group of substrate contact pads 116 with the substrate connecting material 118 during a surface mount connection process, a head-in-pillow formation and a separation formation is avoided.

Figure 2A:
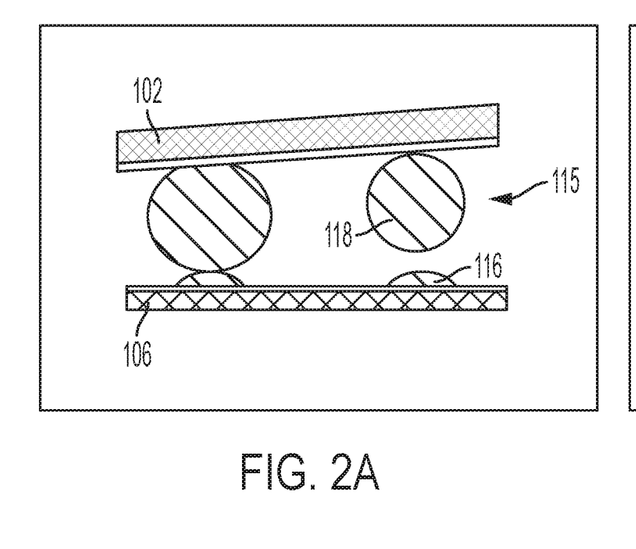
FIG. 2A is an illustration of a separation formation that may occur without the use of the apparatus of FIG. 1, in accordance with an embodiment of the present disclosure.
Figure 2B:
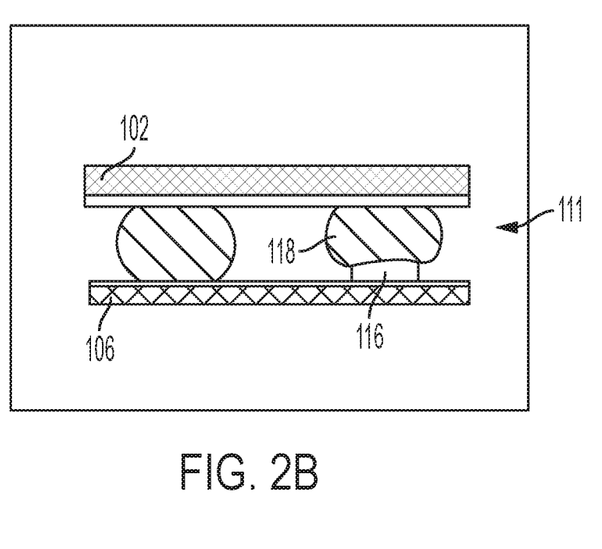
FIG. 2B is an illustration of a head-in-pillow formation that may occur without the use of the apparatus of FIG. 1, in accordance with an embodiment of the present disclosure.

Referring briefly to FIGS. 2A and 2B, a hybrid LGA socket 102 and subtract 106 are illustrated without the barrier 120 and thus are allowed to warp during the reflow soldering process. As aforementioned, the high temperatures used during reflow soldering can cause a hybrid LGA socket 102 to expand, contract, bend, distort, or warp, leading to misaligned or non-wet connections between the hybrid LGA socket 102 and the substrate. These problems can increase with larger hybrid LGA sockets 102, as the higher surface areas between the sockets and the substrate make it more difficult to maintain sufficient flatness for forming successful electrical connections. Due to differences in coefficients of expansion, differential expansion and contraction of a hybrid LGA socket 102 from heating and cooling of the hybrid LGA socket 102 during reflow soldering can cause a permanent distortion or warpage of the finished socket assembly, especially for large hybrid LGA sockets 102.

Additionally, while the hybrid LGA socket 102 is warping during reflow soldering, the group of substrate contact pads 116 may be separate from the substrate connecting material 118, as shown in FIG. 2. While the group of substrate contact pads 116 are separate from the substrate connecting material 118, the substrate connecting material 118 may cool partially or fully. If the substrate connecting material 118 cools fully, the hybrid LGA socket 102 may straighten out (i.e., unwarp) after reflow soldering is complete and the substrate connecting material 118 may not form a welded connection with the top of the group of substrate contact pads 116, thus leaving a separation formation 115 illustrated in FIG. 2A. The separation formation 115 may eliminate electrical connectivity between the hybrid LGA socket 102 and the substrate 106 at the location of the separation formation 115. If the substrate connecting material 118 cools partially, the hybrid LGA socket 102 may straighten back out (i.e., unwarp) after reflow soldering is complete and the substrate connecting material 118 may rest upon the top of the group of substrate contact pads 116, thus leaving a head-in-pillow formation 111 illustrated in FIG. 2B. The head-in-pillow formation 111 may decrease electrical connectivity between the hybrid LGA socket 102 and the substrate 106 at the location of the head-in-pillow formation 111.

Referring back to FIG. 1, the barrier 120 is secured to the substrate 106 at a selected distance D1, via one or more fastening mechanisms 119, such that a gap G1 of a selected width W1 is formed between the barrier 120 and the hybrid LGA socket 102. The fastening mechanism 119 maintains the selected distance D1 between the barrier 120 and the substrate 106 during a surface mount connection process connecting the hybrid LGA socket 102 and the substrate 106. By maintaining the gap G1 at the selected width W1, if the hybrid LGA socket 102 were to warp it would impact the barrier 120 and the barrier 120 would act as a hard stop to prevent the hybrid LGA socket 102 from warping any further. The housing frame 143 may be the first and only part of the hybrid LGA socket 102 to impact the barrier 120 if the hybrid LGA socket 102 were to warp during the surface mount connection process. The selected width W1 may be selected in order to ensure constant contact of the group of socket contact pads 110 with the substrate connecting material 118 and the group of substrate contact pads 116 with the substrate connecting material 118 throughout the reflow soldering process, thus preventing the separation formation 115 or the head-in-pillow formation 111. It is understood that the actual size of the selected width W1 may vary depending upon multiple factors including but not limited to the size of the components within the apparatus 100 and the coefficient of expansion of each of the components within the apparatus 100. The components of the apparatus 100 include the a hybrid LGA socket 102, the substrate 106, the group of socket contact pads 110, the group of socket contact posts 112, the group of substrate contact pads 116, the substrate connecting material 118, the fastening mechanism 119, and the orifice 122.

The hybrid LGA socket 102 provides electrical connections between the area array device 104 and the substrate 106. The hybrid LGA socket 102, in a further embodiment, may provide electrical connections from the area array device 104 and/or the substrate 106 to other electrical devices. The hybrid LGA socket 102, in one embodiment, is formed of a durable, insulating material, such as a plastic, ceramic, or the like. In a further embodiment, the hybrid LGA socket 102 may include multiple layers of materials, such as electrically conductive layers, insulating layers, structural support layers, stiffening layers, heat dissipation layers, and the like. In another embodiment, the hybrid LGA socket 102 is formed of a plastic or other polymer material using an injection molding process.

The hybrid LGA socket 102, in the depicted embodiment, has a first surface 102A with the socket contact pads 110 that are electrically coupled to the substrate contact pads 116. The hybrid LGA socket 102, in the depicted embodiment, have a second surface 102B opposite the first surface 102A with the socket contact posts 112 that provide electrical connections for the group of area array contact pads 114 on the area array device 104. In the depicted embodiment, the hybrid LGA socket 102 is surface mounted directly onto the substrate 106 with the connecting material 118 and the array of socket contact posts 112 form pressure spring connections with the area array device 104.

While rows of fourteen area array contact pads 114, socket contact posts 112, socket contact pads 110, and substrate contact pads 116 are depicted in the cross-sectional views of FIG. 1 for clarity, in further embodiments, other numbers may be used. For example, in one embodiment, the apparatus 100 may include large arrays of hundreds or thousands of area array contact pads 114, socket contact posts 112, socket contact pads 110, and substrate contact pads 116, or the like. One of skill in the art, in view of this disclosure, will recognize other patterns, numbers, and arrangements of area array contact pads 114, socket contact posts 112, socket contact pads 110, and substrate contact pads 116 that may be used.

In the depicted embodiment, the socket contact pads 110 are disposed on the first surfaces of each of the hybrid LGA socket 102, facing the substrate 106. The socket contact pads 110 are electrically conductive, and may be formed of one or more electrically conductive materials such as copper, gold, nickel, and/or another electrically conductive material. The socket contact pads 110 may include an alloy, may be plated, or may be otherwise finished or treated to facilitate electrical connections, prevent corrosion, and the like.

In the depicted embodiment, the socket contact pads 110 provide electrical connections for corresponding substrate contact pads 116. In the depicted embodiment, the socket contact pads 110 are electrically and mechanically coupled to the substrate contact pads 116 by the connecting material 118, which forms a surface mount connection between the hybrid LGA socket 102 and the substrate 106. For example, in various embodiments, the connecting material 118 may include solder, electrochemical plating, and/or another connecting material capable of electrically and mechanically coupling the socket contact pads 110 to the substrate contact pads 116.

The socket contact pads 110, in one embodiment, form a pattern corresponding to a pattern of the substrate contact pads 116. In one embodiment, there is a one-to-one ratio between the socket contact pads 110 and the substrate contact pads 116. In a further embodiment, the group of socket contact pads 110 may include one or more extraneous socket contact pads 110 that do not correspond to a substrate contact pad 116. In another embodiment, the substrate 106 may include one or more extraneous substrate contact pads 116 that do not correspond to a socket contact pad 110. For example, in one embodiment, the substrate 106 may include extraneous substrate contact pads 116 for compatibility with more than one type of hybrid LGA socket 102 and/or area array device 104 or the like. As described in greater detail below, the area array device 104 may include an integrated circuit device, a chip carrier, a circuit board, or the like with an area array of contacts on one side of the area array device 104.

In one embodiment, surface and material characteristics of the first surface of the hybrid LGA socket 102 affect the alignment or orientation of the socket contact pads 110 during a surface mount connection process connecting the socket contact pads 110 to the substrate contact pads 116. The hybrid LGA socket 102, in one embodiment, are formed of a plastic or other polymeric material, and the surface mount connection process may change one or more surface characteristics of the first surface of the hybrid LGA socket 102.

For example, in one embodiment, flatness characteristics of the first surface of the hybrid LGA socket 102 affect the ability of the connecting material 118 to wet to both the socket contact pads 110 and the substrate contact pads 116 to complete an electrical connection between them during a surface mount connection process such as reflow soldering or the like. In another example, in one embodiment, the coefficient of thermal expansion of the hybrid LGA socket 102 may affect the ability of the connecting material 118 to wet to both the socket contact pads 110 and the substrate contact pads 116 during a surface mount connection process due to expansion of the hybrid LGA socket 102 or the like. In one embodiment, the barrier 120 maintains a predetermined alignment of the socket contact pads 110 with the substrate contact pads 116 during a surface mount connection process by preventing warping of the hybrid LGA socket 102 beyond the gap G1.

In the depicted embodiment, the socket contact posts 112 extend from the second surface 102B of the hybrid LGA socket 102, facing the area array device 104. The socket contact posts 112 are electrically conductive, and may be formed of one or more electrically conductive materials such as copper, gold, nickel, and/or another electrically conductive material. The socket contact posts 112 may include an alloy, may be plated, or may be otherwise finished or treated to facilitate electrical connections, prevent corrosion, and the like. In one embodiment, the socket contact posts 112 are formed of the same material as the socket contact pads 110. In a further embodiment, the socket contact posts 112 may be integrally connected with the socket contact pads 110 and formed of a continuous piece of material.

The socket contact posts 112, in the depicted embodiment, provide electrical connections for corresponding area array contact pads 114. In the depicted embodiment, the socket contact posts 112 are electrically coupled to the area array contact pads 114 by the spring pressure between the socket contact posts 112 and the area array contact pads 114.

The socket contact posts 112, in one embodiment, form a pattern corresponding to a pattern of the area array contact pads 114. In one embodiment, there is a one-to-one ratio between the socket contact posts 112 and the area array contact pads 114. In a further embodiment, the group of socket contact posts 112 may include one or more extraneous socket contact posts 112 that do not correspond to an area array contact pad 114. In another embodiment, the area array device 104 may include one or more extraneous area array contact pads 114 that do not correspond to a socket contact post 112. For example, in one embodiment, the group of socket contact posts 112 may include extraneous socket contact posts 112 for compatibility with more than one type of area array device 104 or the like.

In a further embodiment, the second surface 102B of the hybrid LGA socket 102 may include one or more alignment and/or fastening features that receive and/or align the area array device 104 relative to the socket contact posts 112. The second surface 102B of the hybrid LGA socket 102, in another embodiment, may be positioned to prevent the socket contact posts 112 from contacting each other as the socket contact posts 112 compresses toward the hybrid LGA socket 102.

In the depicted embodiment, each socket contact post 112 is integrated with an opposite socket contact pad 110, providing a direct one-to-one pass-through electrical connection between the area array contact pads 114 and the substrate contact pads 116. In a further embodiment, the hybrid LGA socket 102 may include one or more internal electrical connections that re-route electrical connections between socket contact posts 112 and socket contact pads 110. An internal electrical connection within the hybrid LGA socket 102 may electrically connect a socket contact pad 110 and a socket contact post 112 that are not aligned, may electrically connect a socket contact pad 110 and/or a socket contact post 112 with one or more electrical components, or the like.

In the depicted embodiment, the socket contact posts 112 are each compressible contact posts or pins formed into cantilever beams. In a further embodiment, the socket contact posts 112 may include one or more other types of spring contacts, such as C springs, fuzz buttons, radial springs, contact pads, and/or another type of electrically conductive spring contact. Contact with the area array contact pads 114, in the depicted embodiment, compresses the group of socket contact posts 112 toward the hybrid LGA socket 102, forming electrical connections between the area array contact pads 114 and the socket contact posts 112.

In the depicted embodiment, the socket contact posts 112 are integrally connected with the socket contact pads 110 and are formed of a continuous piece of material. For example, in one embodiment, a socket contact post 112 and a corresponding socket contact pad 110 may be stamped from a single sheet of electrically conductive material, formed from a single electrically conductive wire, or the like. In a further embodiment, the socket contact posts 112 and corresponding socket contact pads 110 may be constructed of separate materials that are electrically coupled. For example, the socket contact posts 112 and corresponding socket contact pads 110 may be electrically coupled by internal electrical connections within the hybrid LGA socket 102, through contact with a conductor, by welding, by soldering, through electrical connectors, or the like.

In one embodiment, the hybrid LGA socket 102 has several through holes. In a further embodiment, the socket contact pads 110 extend from openings of the holes on the first side of the hybrid LGA socket 102 and the socket contact posts 112 extend from opposite openings of the holes on the second side of the hybrid LGA socket 102. In one embodiment, a conductor extends through the hole between a socket contact pad 110 and a socket contact post 112 to electrically couple the socket contact pad 110 and the socket contact post 112. In one embodiment, the socket contact posts 112 and/or the socket contact pads 110 may be inserted into the hybrid LGA socket 102 using a staking or stitching process.

In one embodiment, the area array device 104 includes an integrated circuit device, a chip carrier, a circuit board, or the like with the area array contact pads 114 forming an area array on one side of the area array device 104. For example, in one embodiment, the area array device 104 may include an LGA device such as a processor or the like. The area array device 104 may include an integrated circuit itself, an integrated circuit mounted on a substrate, a circuit board, a circuit board with one or more electrical components, and/or another device with an area array of area array contact pads 114. The area array contact pads 114 on the area array device 104 are electrically conductive, and may be formed of one or more materials such as copper, gold, nickel, and the like. The area array contact pads 114 may include an alloy, may be plated, or may be otherwise finished or treated to facilitate electrical connections, prevent corrosion, and the like. In one embodiment, the area array contact pads 114 are plated with gold, a gold alloy, or the like. In one embodiment, the area array contact pads 114 are plated onto the area array device 104 using a plating process.

In the depicted embodiment, the orifice 122 is located within the barrier 120. The barrier 120 includes a first side 120A and a second side 120B opposite the first side 120A. The orifice 122 extends from the first side 120A of the barrier 120 to the second side 120B of the barrier 120. The orifice 122 allows heat to radiate away from the area array device 104 and through the orifice 122. There may be one or more orifices 122 present in the barrier 120, as describer further herein.

In the depicted embodiment, the substrate 106 is a planar element that provides structural support and electrical connections to the area array device 104. The substrate 106, in one embodiment, may include multiple layers, such as electrically conductive layers, insulating layers, structural support layers, stiffening layers, heat dissipation layers, and the like. In one embodiment, the substrate 106 is a printed circuit board that may include one or more copper sheets laminated onto a non-conductive dielectric substrate using epoxy resin or the like.

The substrate contact pads 116 on the substrate 106 are electrically conductive, and may be formed of one or more materials such as copper, gold, nickel, and the like. The substrate contact pads 116 may include an alloy, may be plated, or may be otherwise finished or treated to facilitate electrical connections, prevent corrosion, and the like. In one embodiment, the substrate contact pads 116 are plated onto the substrate 106 using a plating process.

In the depicted embodiment, the substrate connecting material 118 electrically and mechanically couples the substrate contact pads 116 to the socket contact pads 110. In one embodiment, the substrate connecting material 118 comprises a lead-tin solder such as a eutectic or other lead-tin solder, a lead-free solder, or other type of solder capable of providing an electrical and structural connection. In another embodiment, the connecting material 118 may include a non-solder electrical coupling material, such as electrochemical plating or the like.

In one embodiment, the connecting material 118, prior to a surface mount connection process, may be initially disposed on the socket contact pads 110, the substrate contact pads 116, or both. For example, in one embodiment, the connecting material 118 includes a ball grid array ("BGA") of solder balls disposed on the socket contact pads 110 and/or the substrate contact pads 116. In response to melting during a reflow solder process or in response to another surface mount connection process, in one embodiment, the connecting material 118 electrically and mechanically couples the socket contact pads 110 to the substrate contact pads 116. In one embodiment, the barrier 120 maintains a predetermined alignment of the hybrid LGA socket 102 during the reflow solder process or other surface mount connection process.

In one embodiment, the surface mount connection process heats the connecting material 118 and may also heat other elements of the apparatus 100, such as the substrate 106 and the hybrid LGA socket 102. The surface mount connection process may heat the connecting material 118 in a furnace, such as a belt furnace, a vacuum furnace, a box furnace, or the like, using conduction, convection, infrared, or other heating. In a further embodiment, the surface mount connection process may include further processing, such as quality checks for non-wet connections, flux cleaning, under-filling, connection to additional devices and/or components, and the like.

Figure 3A:
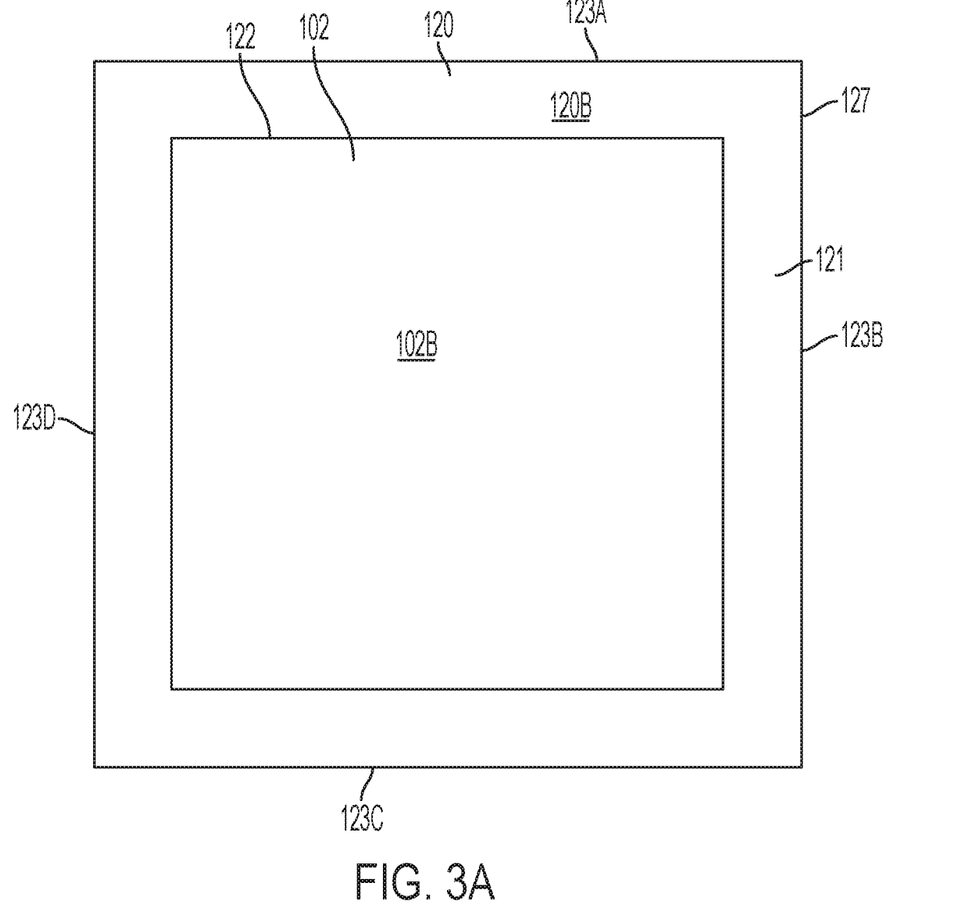
FIG. 3A is a top view of a barrier having an orifice to allow radiant heat to escape from the socket, in accordance with an embodiment of the present disclosure.

Referring now to FIGS. 3A, 3B, 3C, and 3D, barriers 120 having orifices 122 of various shapes and quantity are illustrated, in accordance with embodiments of the present disclosure. A top view of a barrier 120 having a single orifice 122 is illustrated in FIG. 3A. The second surface 102B of the hybrid LGA socket 102 is visible through the orifice 122 as the orifice 122 extends from the second side 120B of the barrier 130 to the first side 120A (see FIG. 1) of the barrier 120. As shown in FIG. 3A, the orifice 122 is centered within the barrier 120, the barrier 120 forming a picture frame or border 121 around the orifice 122. The border 121 forms an outer perimeter 127 of the barrier 120 and has four sides 123 including a first side 123A, a second side 123B, a third side 123C, and a fourth side 123D. In an embodiment, the orifice 122 may be square in shape. The orifice 122 allows heat to escape from the hybrid LGA socket 102 through the orifice 122, while the barrier 120 remains to prevent excessive warping of the hybrid LGA socket 102 during surface mount connection process (e.g., solder reflow).

Figure 3B:
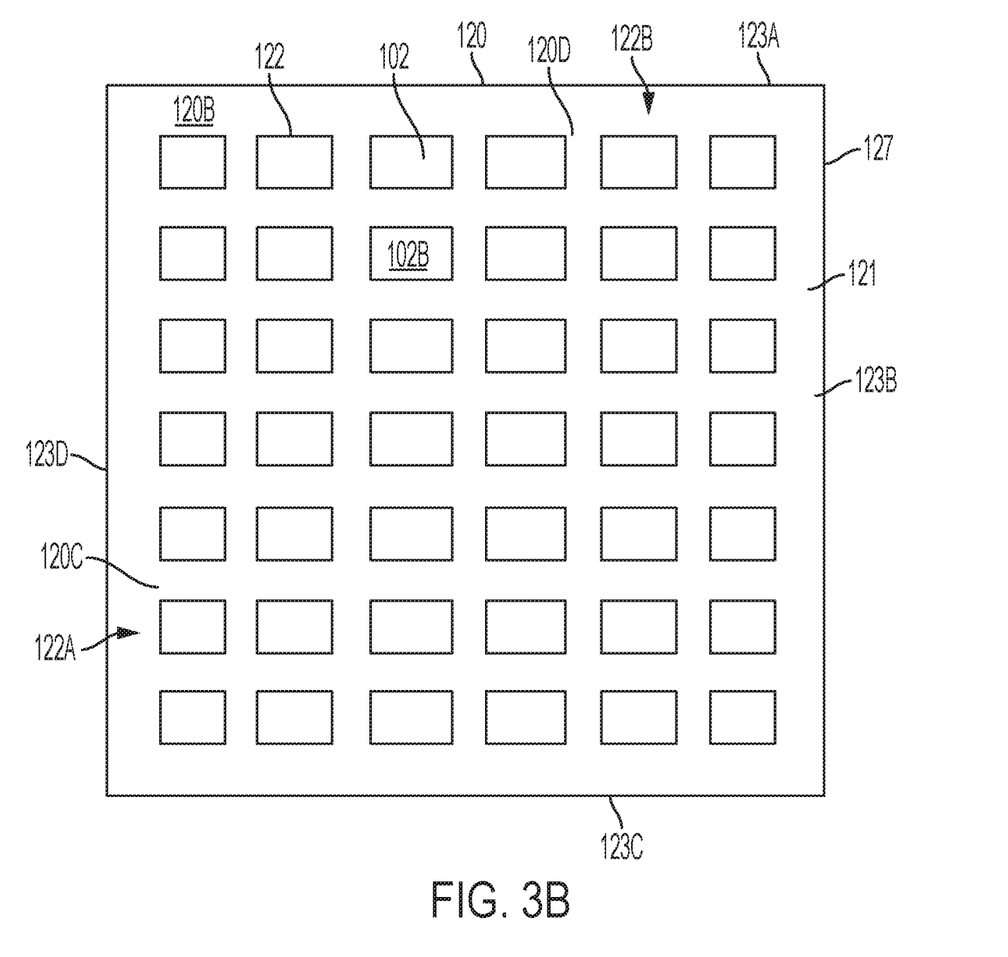
FIG. 3B is a top view of a barrier having orifices in arranged in a grid pattern to allow radiant heat to escape from the socket, in accordance with an embodiment of the present disclosure.

A top view of a barrier 120 having multiple orifices 122 arranged in a grid pattern is illustrated in FIG. 3B. The second surface 102B of the hybrid LGA socket 102 is visible through the orifices 122 as the orifices 122 extend from the second side 120B of the barrier 130 to the first side 120A (see FIG. 1) of the barrier 120. As shown in FIG. 3B, the orifices 122 are organized in a square grid pattern having rows 122A and columns 122B which are centered within the barrier 120, the barrier 120 forming a picture frame or border 121 around the grid of orifices 122. The border 121 forms an outer perimeter 127 of the barrier 120 and has four sides 123 including a first side 123A, a second side 123B, a third side 123C, and a fourth side 123D. The barrier 120 includes row cross-braces 120C extending from the second side 123B of the border 121 to the third side 123C of the border 121 to form the rows 122A of the orifices 122. The row cross-braces 120C are spaced equidistantly between the first side 123A of the border 121 and the third side 123C of the border 121. The barrier 120 includes column cross-braces 120D extending from the first side 123A of the border 121 to the third side 123C of the border 121 to form the columns 122B of the orifices 122. The column cross-braces 120D are spaced equidistantly between the second side 123B of the border 121 and the fourth side 123D of the border 121. In an embodiment, the orifices 122 may be square in shape. It is understood that there may be any number of orifices 122 having any shape. The orifices 122 allow heat to escape from the hybrid LGA socket 102 through the orifices 122, while the barrier 120 remains to prevent excessive warping of the hybrid LGA socket 102 during surface mount connection process (e.g., solder reflow).

Figure 3C:
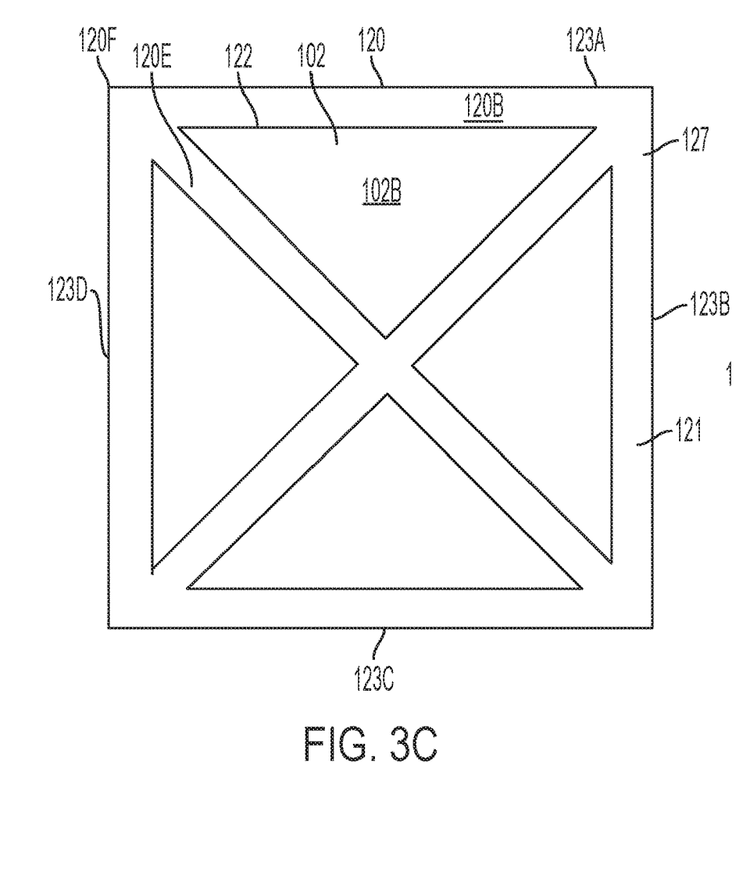
FIG. 3C is a top view of a barrier having orifices in arranged in a triangular grid pattern to allow radiant heat to escape from the socket, in accordance with an embodiment of the present disclosure.

A top view of a barrier 120 having multiple orifices 122 arranged in a triangular grid pattern is illustrated in FIG. 3C. The second surface 102B of the hybrid LGA socket 102 is visible through the orifices 122 as the orifices 122 extend from the second side 120B of the barrier 130 to the first side 120A (see FIG. 1) of the barrier 120. As shown in FIG. 3C, the orifices 122 are organized in a triangular grid pattern having four triangular shaped orifices 122 within the barrier 120, the barrier 120 forming a picture frame or border 121 around the grid of orifices 122. The border 121 forms an outer perimeter 127 of the barrier 120 and has four sides 123 including a first side 123A, a second side 123B, a third side 123C, and a fourth side 123D. The barrier 120 includes barrier diagonal cross-braces 120E extending between corners 120F of the border 121 to form the triangular shaped orifices 122. The barrier 120 includes four corners 120F and two barrier diagonal cross-braces 120E each extending between two corners 120F. It is understood that there may be any number of orifices 122 having any shape. The orifices 122 allow heat to escape from the hybrid LGA socket 102 through the orifices 122, while the barrier 120 remains to prevent excessive warping of the hybrid LGA socket 102 during surface mount connection process (e.g., solder reflow).

Figure 3D:
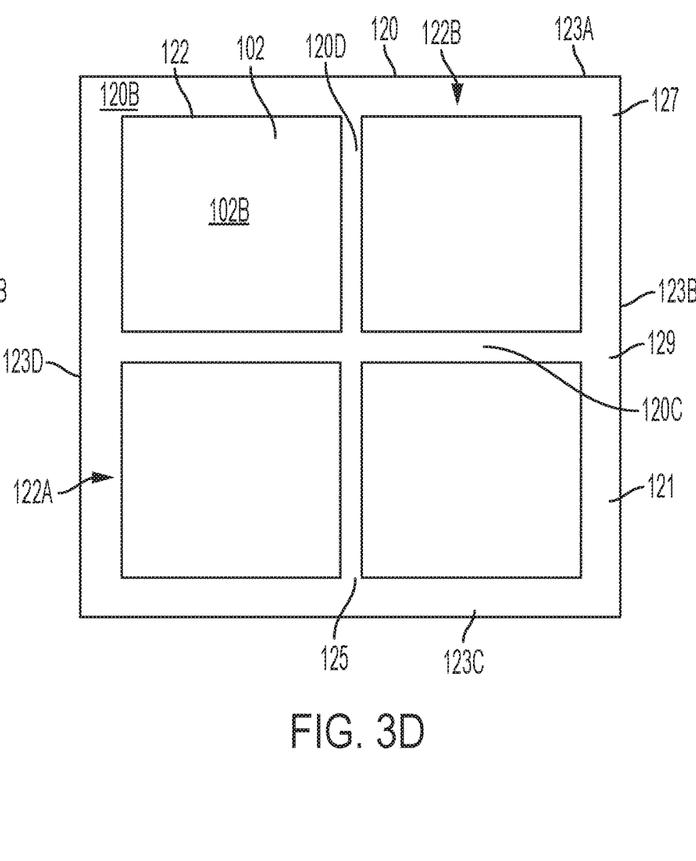
FIG. 3D is a top view of a barrier having orifices in arranged in a square grid pattern to allow radiant heat to escape from the socket, in accordance with an embodiment of the present disclosure.

A top view of a barrier 120 having multiple orifices 122 arranged in a grid pattern is illustrated in FIG. 3D. The second surface 102B of the hybrid LGA socket 102 is visible through the orifices 122 as the orifices 122 extend from second side 120B of the barrier 130 to the first side 120A (see FIG. 1) of the barrier 120. As shown in FIG. 3D, the orifices 122 are organized in a square grid pattern having two rows 122A and two columns 122B which are within the barrier 120, the barrier 120 forming a picture frame or border 121 around the grid of orifices 122. The border 121 forms an outer perimeter 127 of the barrier 120 and has four sides 123 including a first side 123A, a second side 123B, a third side 123C, and a fourth side 123D. The barrier 120 includes a row cross-brace 120C extending from the second side 123B of the border 121 to the third side 123C of the border 121 to form two rows 122A of the orifices 122. The row cross-brace 120C may be located at a mid-point 129 of the second side 123B and the fourth side 123D. The barrier 120 includes a column cross-brace 120D extending from the first side 123A of the border 121 to the third side 123C of the border 121 to form the columns 122B of the orifices 122. The column cross-brace 120D may be located at a mid-point 125 of the first side 123A and the third side 123C. In an embodiment, the orifices 122 may be square in shape. It is understood that there may be any number of orifices 122 having any shape. The orifices 122 allow heat to escape from the hybrid LGA socket 102 through the orifices 122, while the barrier 120 remains to prevent excessive warping of the hybrid LGA socket 102 during surface mount connection process (e.g., solder reflow).

Figure 4:
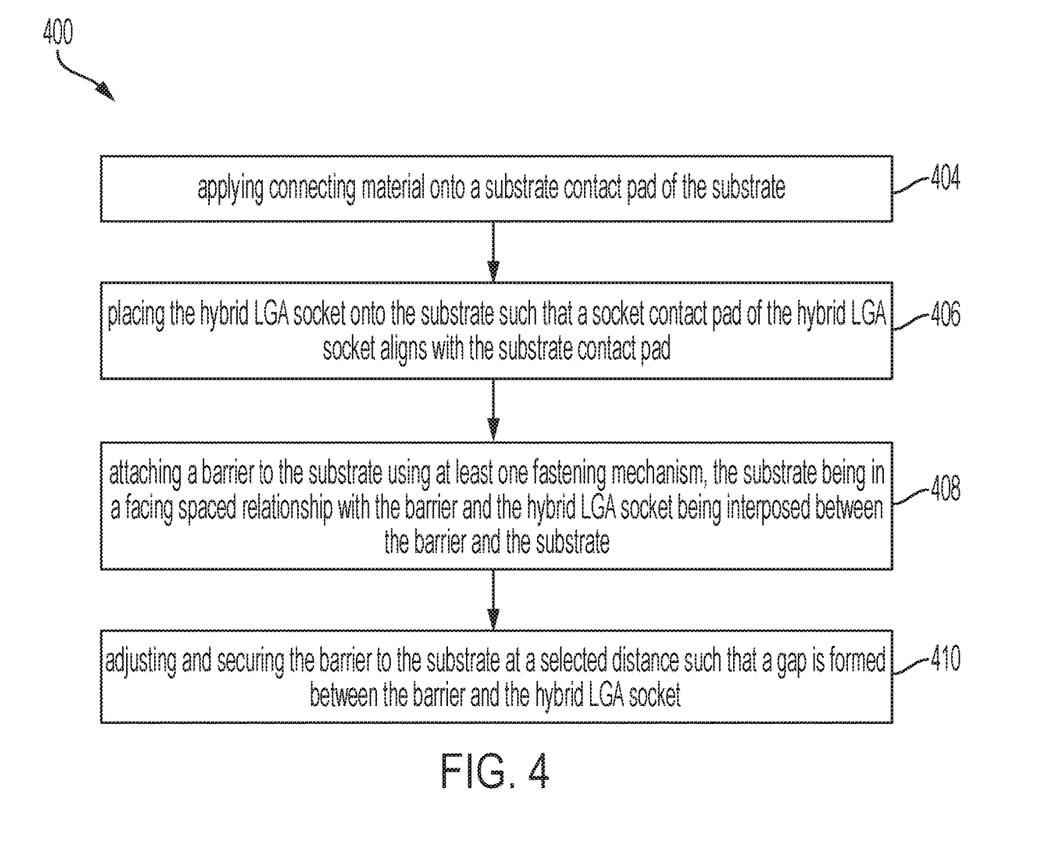
FIG. 4 is a schematic flow chart diagram illustrating a method of a surface mount process connecting the socket to a substrate, in accordance with an embodiment of the present disclosure.

Referring now to FIG. 4, with continued reference to FIGS. 1-3, a schematic flow chart diagram illustrating a method 400 of surface mount connecting a hybrid LGA socket 102 to a substrate 106, in accordance with an embodiment of the present disclosure. At block 404, connecting material 118 is applied onto a substrate contact pad 116 of the substrate 106. At block 406, the hybrid LGA socket 102 is placed onto the substrate 106 such that a socket contact pad 110 of the hybrid LGA socket 102 aligns with the substrate contact pad 116. At block 408, a barrier 120 is attached to the substrate 106 using at least one fastening mechanism 119. The substrate 106 being in a facing spaced relationship with the barrier 120 and the hybrid LGA socket 102 being interposed between the barrier 120 and the substrate 106. At block 410, the barrier 120 is adjusted and secured to the substrate 106 at a selected distance D1 such that a gap G1 is formed between the barrier 120 and the hybrid LGA socket 102.

The method 400 may also include heating at least the hybrid LGA socket 102, the connecting material 118, the substrate 106, the barrier 120, and the at least one fastening mechanism 119.

In one embodiment, the surface mount connection process is a solder reflow process that melts the connecting material 118 to electrically and mechanically couple the socket contact pads 110 to the substrate contact pads 116. The connecting material 118 may melt in a furnace, such as a belt furnace, a vacuum furnace, a box furnace, or the like, using conduction, convection, infrared, or other heating.

In a further embodiment, a device assembler may mount the hybrid LGA socket 102 to the substrate 106 using a different surface mount connection process, such as an electrochemical plating process, a welding process, or another surface mount connection process that mechanically and electrically couples the socket contact pads 110 to the substrate contact pads 116. In a further embodiment, the connected hybrid LGA socket 102 and substrate 106 may undergo further processing, such as quality checks for non-wet connections, flux cleaning, under-filling, connection to additional devices and/or components, and the like.

The method 400 may further include radiating heat from the hybrid LGA socket 102 through an orifice 122 located in the barrier 120. The orifice 122 extending from a first side 120A of the barrier 120 to a second side 120B of the barrier 120. The orifice 122 may be located within the border 121. The orifice 122 may be square shaped, triangular shaped, round shaped, or any other shape known to one of skill in the art.

The method 400 may further include radiating heat from the hybrid LGA socket 102 through orifices 122 located in the barrier 120. Each of the orifices 122 extending from a first side 120A of the barrier 120 to a second side 120B of the barrier 120. The orifices 122 may be in a grid pattern. The orifices 122 may be square in shape.

The method 400 may further include radiating heat from the hybrid LGA socket 102 through four orifices 122 located in the barrier 120. Each of the four orifices 122 extending from a first side 120A of the barrier 120 to a second side 120B of the barrier 120. In one embodiment, the four orifices 122 are in a triangular grid pattern. In another embodiment, the four orifices 122 are in a square grid pattern and square in shape.

While the above description has described the flow process of FIG. 4 in a particular order, it should be appreciated that unless otherwise specifically required in the attached claims that the ordering of the steps may be varied.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An apparatus to aid a surface mount connection process, the apparatus comprising:
   a barrier;
   a substrate in a facing spaced relationship with the barrier;
   a hybrid land grid array (LGA) socket interposed between the barrier and the substrate, the hybrid LGA socket comprising a first surface and a second surface opposite the first surface, wherein the first surface comprises socket contact pads and the second surface comprising socket contact posts; and
   at least one fastening mechanism securing the barrier to the substrate at a selected distance such that a gap is formed between the barrier and the hybrid LGA socket, wherein the barrier is directly connected to the substrate through the at least one fastening mechanism and not through the hybrid LGA socket.

2. The apparatus of claim 1, wherein the fastening mechanism maintains the selected distance between the barrier and the substrate during a surface mount connection process connecting the hybrid LGA socket and the substrate.

3. The apparatus of claim 1, wherein the barrier further comprises:
   a first side;
   a second side opposite the first side; and
   an orifice extending from the first side to the second side.

4. The apparatus of claim 1, wherein the barrier further comprises:
   a first side;
   a second side opposite the first side; and
   orifices in a grid pattern, each of the orifices extending from the first side to the second side.

5. The apparatus of claim 4, wherein each of the orifices are square in shape.

6. The apparatus of claim 1, wherein the barrier further comprises:
   a first side;
   a second side opposite the first side; and
   four orifices in a triangular grid pattern, each of the four orifices extending from the first side to the second side.

7. The apparatus of claim 1, wherein the barrier further comprises:
   a first side;
   a second side opposite the first side; and
   four orifices in a square grid pattern, each of the four orifices extending from the first side to the second side, wherein each of the four orifices are square in shape.

8. The apparatus of claim 1, wherein the barrier further comprises:
   a first side;
   a second side opposite the first side;
   a border forming an outer perimeter of the barrier; and
   an orifice extending from the first side to the second side, the orifice being located within the border.

9. The apparatus of claim 1, wherein the surface mount connection process is a solder reflow process.

10. A method of surface mount connecting a hybrid land grid array (LGA) socket to a substrate, the method comprising:
    applying connecting material onto a substrate contact pad of the substrate;
    placing the hybrid LGA socket onto the substrate such that a socket contact pad of the hybrid LGA socket aligns with the substrate contact pad, the hybrid LGA socket comprising a first surface and a second surface opposite the first surface, wherein the first surface comprises socket contact pads and the second surface comprising socket contact posts;
    attaching a barrier to the substrate using at least one fastening mechanism, the substrate being in a facing spaced relationship with the barrier and the hybrid LGA socket being interposed between the barrier and the substrate; and
    adjusting and securing the barrier to the substrate at a selected distance such that a gap is formed between the barrier and the hybrid LGA socket, wherein the barrier is directly connected to the substrate through the at least one fastening mechanism and not through the hybrid LGA socket.

11. The method of claim 10, further comprising:
heating at least the hybrid LGA socket, the connecting material, the substrate, the barrier, and the at least one fastening mechanism.

12. The method of claim 11, further comprising:
radiating heat from the hybrid LGA socket through an orifice located in the barrier, the orifice extending from a first side of the barrier to a second side of the barrier.

13. The method of claim 11, further comprising:
radiating heat from the hybrid LGA socket through orifices located in the barrier, the orifice extending from a first side of the barrier to a second side of the barrier, wherein the orifices are in a grid pattern.

14. The method of claim 13, wherein each of the orifices are square in shape.

15. The method of claim 11, further comprising:
radiating heat from the hybrid LGA socket through four orifices located in the barrier, each of the four orifices extending from a first side of the barrier to a second side of the barrier, wherein the four orifices are in a triangular grid pattern.

16. The method of claim 11, further comprising:
radiating heat from the hybrid LGA socket through four orifices located in the barrier, each of the four orifices extending from a first side of the barrier to a second side of the barrier, wherein the four orifices are in a square grid pattern, and wherein each of the four orifices are square in shape.

17. The method of claim 11, further comprising:
radiating heat from the hybrid LGA socket through an orifice located in the barrier, the orifice extending from a first side of the barrier to a second side of the barrier, wherein the orifice is located within a border of the barrier, the border forming an outer perimeter of the barrier.

18. A barrier to aid a surface mount connection process, the barrier comprising:
a first side;
a second side opposite the first side;
one or more orifices extending from the first side to the second side; and
at least one fastening mechanism operable to secure the barrier to a substrate at a selected distance such that a gap is formed between the barrier and a hybrid land grid array (LGA) socket interposed between the barrier and the substrate, the hybrid LGA socket comprising a first surface and a second surface opposite the first surface, wherein the first surface comprises socket contact pads and the second surface comprising socket contact posts,
wherein the barrier is configured to directly connect to the substrate through the at least one fastening mechanism and not through the hybrid LGA socket.

19. The barrier of claim 18, wherein the fastening mechanism maintains the selected distance between the barrier and the substrate during a surface mount connection process connecting the hybrid LGA socket and the substrate.

20. The barrier of claim 18, wherein the one or more orifices are in a grid pattern.

* * * * *